United States Patent
Goto et al.

(10) Patent No.: US 9,058,914 B2
(45) Date of Patent: Jun. 16, 2015

(54) OXIDE SINTERED COMPACT AND SPUTTERING TARGET

(75) Inventors: Hiroshi Goto, Takasago (JP); Yuki Iwasaki, Takasago (JP); Masaya Ehira, Takasago (JP); Yoichiro Yoneda, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 114 days.

(21) Appl. No.: 13/885,868

(22) PCT Filed: Nov. 11, 2011

(86) PCT No.: PCT/JP2011/076066
§ 371 (c)(1),
(2), (4) Date: May 16, 2013

(87) PCT Pub. No.: WO2012/067036
PCT Pub. Date: May 24, 2012

(65) Prior Publication Data
US 2013/0234081 A1    Sep. 12, 2013

(30) Foreign Application Priority Data
Nov. 16, 2010 (JP) .................... 2010-255434

(51) Int. Cl.
*H01B 1/08*    (2006.01)
*C04B 35/453*    (2006.01)
(Continued)

(52) U.S. Cl.
CPC ............... *H01B 1/08* (2013.01); *C04B 35/453* (2013.01); *C04B 35/457* (2013.01);
(Continued)

(58) Field of Classification Search
CPC ......... H01B 1/08; C04B 35/00; C04B 35/453
USPC ........... 252/518.1, 519.5, 519.51; 204/192.15
See application file for complete search history.

(56) References Cited

U.S. PATENT DOCUMENTS 6,627,119 B2 * 9/2003 Kaneko et al. ............ 252/519.51
8,524,123 B2 * 9/2013 Yano et al. ................ 252/520.1
(Continued)

FOREIGN PATENT DOCUMENTS

JP    9 71860    3/1997
JP    2004 263273    9/2004
(Continued)

OTHER PUBLICATIONS

Hoel et al "Transparent conducting oxides in the ZnO-In2O3-SnO2 system", Chem. Mater, 2010, 22, 3569-3579.*
(Continued)

*Primary Examiner* — Mark Kopec
(74) *Attorney, Agent, or Firm* — Oblon, McClelland, Maier & Neustadt, L.L.P.

(57) ABSTRACT

This oxide sintered compact is obtained by mixing and sintering powders of zinc oxide, tin oxide and indium oxide. As determined by X-ray diffractometry of this oxide sintered compact, the oxide sintered compact has a $Zn_2SnO_4$ phase as the main phase and contains an $In/In_2O_3$—$ZnSnO_3$ solid solution wherein In and/or $In_2O_3$ is solid-solved in $ZnSnO_3$, but a $Zn_xIn_yO_z$ phase (wherein x, y and z each represents an arbitrary positive integer) is not detected. Consequently, the present invention was able to provide an oxide sintered compact which is suitable for use in the production of an oxide semiconductor film for display devices and has both high electrical conductivity and high relative density. The oxide sintered compact is capable of forming an oxide semiconductor film that has high carrier mobility.

20 Claims, 6 Drawing Sheets

(51) Int. Cl.
*C04B 35/457* (2006.01)
*C04B 35/626* (2006.01)
*C23C 14/08* (2006.01)
*C23C 14/34* (2006.01)

(52) U.S. Cl.
CPC ...... *C04B 35/6261* (2013.01); *C04B 35/62695* (2013.01); *C04B 2235/3284* (2013.01); *C04B 2235/3286* (2013.01); *C04B 2235/3293* (2013.01); *C04B 2235/80* (2013.01); *C23C 14/086* (2013.01); *C23C 14/3414* (2013.01); *C04B 2235/6567* (2013.01); *C04B 2235/6585* (2013.01); *C04B 2235/77* (2013.01)

(56) References Cited

U.S. PATENT DOCUMENTS

| | | | |
|---|---|---|---|
| 8,753,548 B2 * | 6/2014 | Yano et al. | 252/519.51 |
| 2004/0191530 A1 | 9/2004 | Inoue et al. | |
| 2007/0215456 A1 | 9/2007 | Abe et al. | |
| 2009/0197757 A1 | 8/2009 | Fukushima | |
| 2009/0308635 A1 | 12/2009 | Yano et al. | |
| 2010/0089621 A1 | 4/2010 | Stoss et al. | |
| 2010/0170696 A1 | 7/2010 | Yano et al. | |
| 2010/0266787 A1 | 10/2010 | Yano et al. | |
| 2011/0121244 A1 | 5/2011 | Yano et al. | |
| 2011/0240934 A1 | 10/2011 | Abe et al. | |
| 2011/0260121 A1 | 10/2011 | Yano et al. | |
| 2013/0001080 A1 | 1/2013 | Abe et al. | |
| 2013/0112971 A1 | 5/2013 | Yano et al. | |
| 2013/0248858 A1 | 9/2013 | Morita et al. | |
| 2013/0270109 A1 | 10/2013 | Morita et al. | |
| 2014/0054588 A1 | 2/2014 | Maeda et al. | |

FOREIGN PATENT DOCUMENTS

| | | |
|---|---|---|
| JP | 2005 307269 | 11/2005 |
| JP | 2007 31786 | 2/2007 |
| JP | 2007 63649 | 3/2007 |
| JP | 2007 277075 | 10/2007 |
| JP | 2008 63214 | 3/2008 |
| JP | 2010 18457 | 1/2010 |
| JP | 2010 24087 | 2/2010 |
| JP | 2010 37161 | 2/2010 |
| JP | 2010 514597 | 5/2010 |
| JP | 2010 120803 | 6/2010 |
| JP | 2012-180274 A | 9/2012 |
| TW | 201029952 A1 | 8/2010 |
| WO | 03 008661 | 1/2003 |
| WO | 2007 034733 | 3/2007 |
| WO | 2007 034749 | 3/2007 |
| WO | 2007 037191 | 4/2007 |
| WO | 2010 067571 | 6/2010 |

OTHER PUBLICATIONS

International Search Report Issued Feb. 14, 2012 in PCT/JP11/076066 filed Nov. 11, 2011.
U.S. Appl. No. 14/399,378, filed Nov. 6, 2014, Goto, et al.
U.S. Appl. No. 13/387,522, Office Action, Nov. 6, 2014, OA Response, Feb. 6, 2015.
U.S. Appl. No. 13/636,255, Office Action, Nov. 24, 2014.
U.S. Appl. No. 13/877,065, Final Rejection, Dec. 31, 2014.
U.S. Appl. No. 13/989,944, Office Action, Dec. 5, 2014.
U.S. Appl. No. 13/991,247, Office Action, Jan. 22, 2015.
U.S. Appl. No. 13/982,327, Notice of Allowance, Jan. 16, 2015.
U.S. Appl. No. 13/981,729, Final Rejection, Jan. 21, 2015.
U.S. Appl. No. 14/002,768, 1st Office Action, Sep. 11, 2014, 1st OA Resp, Dec. 9, 2014.
U.S. Appl. No. 14/002,491, 1st Office Action, Sep. 11, 2014, 1st OA Resp, Dec. 11, 2014.
U.S. Appl. No. 14/113,303, Final Rejection, Jan. 28, 2015.
U.S. Appl. No. 14/113,322, 1st Office Action, Nov. 6, 2014.

* cited by examiner

OXIDE SINTERED COMPACT AND SPUTTERING TARGET

TECHNICAL FIELD

The present invention relates to oxide sintered compacts and sputtering targets for use in sputtering deposition of oxide semiconductor thin films of thin-film transistors (TFTs), which thin-film transistors are used in display devices such as liquid crystal displays and organic electroluminescent displays.

BACKGROUND ART

Amorphous (noncrystalline) oxide semiconductors for use in TFTs have higher carrier mobility and larger optical band gaps and can be deposited at lower temperatures than those of general amorphous silicon (a-Si) semiconductors. For these reasons, the amorphous oxide semiconductors are expected to be applied typically to next-generation displays which should have large sizes and high resolutions and should be driven at high speed; and to resin substrates which have poor thermal stability. Deposition of such an oxide semiconductor (film) preferably employs sputtering, in which a sputtering target including the same materials as the film is subjected to sputtering. The resulting thin film deposited by sputtering advantageously excels in in-plane uniformity typically of chemical composition and film thickness in a film-plane direction (in-plane) and can advantageously have the same chemical composition as the sputtering target, as compared to thin films deposited by ion plating, vacuum vapor deposition, or electron beam physical vapor deposition. Sputtering targets are generally formed by mixing oxide powders, sintering the resulting mixture to give a sintered compact, and machining the sintered compact.

Exemplary oxide semiconductors for use in display devices have compositions corresponding to indium-containing amorphous oxide semiconductors [e.g., In—Ga—Zn—O, In—Zn—O, and In—Sn—O (indium-tin oxide; ITO)]. These oxide semiconductors, however, employ indium, which is a rare metal, and may cause higher material cost in mass production process. To avoid this disadvantage, there have been proposed zinc-tin oxide (ZTO) semiconductors which are amorphized by adding Sn to Zn. These have been proposed as oxide semiconductors that do not contain expensive indium, have lower material cost, and are suitable for mass production. PTLs 1 to 4 disclose sputtering targets which are useful for the production of the ZTO semiconductor films.

Among them, PTL 1 proposes a technique of performing sintering for a long time to control the structure to contain no tin oxide phase, so as to suppress the generation of abnormal discharge and cracking during sputtering. PTL 2 proposes a technique of performing two production steps of preparing a calcined powder (partially sintered powder) at a low temperature of 900° C. to 1300° C.; and firing the calcined powder to give a high-density ZTO sintered compact as a sputtering target, so as to suppress abnormal discharge during sputtering. PTL 3 proposes a technique of incorporating a spinel-type $AB_2O_4$ compound to give a sputtering target having better electroconductivity and a high density. PTL 4 proposes a technique of performing two production steps of preparing a calcined powder at a low temperature of 900° C. to 1100° C., and firing the calcined powder to give a dense ZTO sintered compact.

PTL 5 proposes a ZTO sputtering target containing indium in a low content, as a sputtering target which is used for the deposition of transparent conductive films and which has a low resistivity and a high relative density even though having an indium content lower than that of an ITO. In general, reduction in indium content in an ITO causes the resulting sputtering target to have a lower relative density and a higher bulk resistivity. However, the technique disclosed in PTL 5 gives a sputtering target which has a high density and a low resistivity and can less suffer from abnormal discharge upon sputtering, owing to the coexistence of a bixbyite structure compound expressed by $In_2O_3$ with a spinel structure compound expressed by $Zn_2SnO_4$.

CITATION LIST

Patent Literature

PTL 1: Japanese Unexamined Patent Application Publication (JP-A) No. 2007-277075
PTL 2: JP-A No. 2008-63214
PTL 3: JP-A No. 2010-18457
PTL 4: JP-A No. 2010-37161
PTL 5: JP-A No. 2007-63649

SUMMARY OF INVENTION

Technical Problem

Sputtering targets and their material oxide sintered compacts for use in the production of oxide semiconductor films for display devices are desired to have superior electroconductivity and to have high relative densities. Resulting oxide semiconductor films deposited using the sputtering targets are desired to have satisfactory carrier mobility. In addition, such sputtering targets are demanded to be producible through not high-frequency (RF) sputtering but direct-current sputtering that enables high-speed film deposition, in view of productivity and production cost.

However, the technique disclosed in PTL 1 is not proposed from the viewpoint of providing higher density and is insufficient for stable and continuous direct-current discharge. The technique disclosed in PTL 2 is not proposed from the viewpoint of providing better electroconductivity of the oxide sintered compact and is also insufficient for stable and continuous direct-current discharge.

The technique disclosed in PTL 3 is proposed from the viewpoint of providing higher density and better electroconductivity, but employs a sputtering target containing a highly insulative $Ga_2O_3$ phase adversely affecting semiconducting properties of the thin film, and insufficiently ensures in-plane uniformity of the sputtering target and stability in film quality. The technique disclosed in PTL 4 essentially employs RF sputtering that is poor in productivity and is hardly applicable to mass production typically on large-sized glass substrates.

From the viewpoint of use, the sputtering targets disclosed in PTLs 1 to 4 and one disclosed in PTL 5 are all used for film deposition of transparent conductive films, but are not intended to apply to film deposition of TFT oxide semiconductor thin films. For example, the technique disclosed in PTL 5 controls metal compositional ratios in the sputtering target from the viewpoint of properties (e.g., thermal stability and electroconductivity) required of transparent conductive films. Specifically, the technique controls the sputtering target to have an indium compositional ratio within a high range (preferably 0.31 to 0.49), a zinc compositional ratio within a low range (preferably 0.21 to 0.45), and a tin compositional ratio within a low range (preferably 0.15 to 0.3). Even using this sputtering target, however, it is difficult to give an oxide semiconductor thin film having high carrier mobility and exhibiting excellent TFT switching properties.

The present invention has been made under these circumstances, and an object thereof is to provide an oxide sintered compact and a sputtering target which are advantageously used for the production of oxide semiconductor films for display devices, which have satisfactory electroconductivity and high relative densities, and which enable deposition of oxide semiconductor films having satisfactory carrier mobility.

Solution to Problem

The present invention achieves the object and provides, in an embodiment, an oxide sintered compact prepared by mixing and sintering powders of zinc oxide, tin oxide, and indium oxide, in which the oxide sintered compact includes a $Zn_2SnO_4$ phase as a main phase; the oxide sintered compact contains an $In/In_2O_3$—$ZnSnO_3$ solid solution including $ZnSnO_3$ and, dissolved therein, In and/or $In_2O_3^-$; and substantially no $Zn_xIn_yO_z$ phase, wherein x, y, and z are independently arbitrary positive integers, is detected, upon X-ray diffractometry.

In a preferred embodiment of the present invention, the oxide sintered compact includes metal elements Zn, Sn, and In in contents (in atomic percent) of [Zn], [Sn], and [In]; and a ratio of [In] to a total of [Zn], [Sn], and [In] ([Zn]+[Sn]+[In]), a ratio of [Zn] to a total of [Zn] and [Sn] ([Zn]+[Sn]), and a ratio of [Sn] to a total of [Zn] and [Sn] ([Zn]+[Sn]) respectively satisfy conditions expressed as follows:

[In]/([Zn]+[Sn]+[In]) is from 0.01 to 0.30,

[Zn]/([Zn]+[Sn]) is from 0.50 to 0.75,

[Sn]/([Zn]+[Sn]) is from 0.25 to 0.50.

In another preferred embodiment of the present invention, the ratio of [In] to a total of [Zn], [Sn], and [In], the ratio of [Zn] to a total of [Zn] and [Sn], and the ratio of [Sn] to a total of [Zn] and [Sn] respectively satisfy conditions expressed as follows:

[In]/([Zn]+[Sn]+[In]) is from 0.10 to 0.30,

[Zn]/([Zn]+[Sn]) is from 0.50 to 0.67,

[Sn]/([Zn]+[Sn]) is from 0.33 to 0.50.

In still another preferred embodiment of the present invention, the oxide sintered compact has a maximum peak intensity of $I_1$ in a (311) plane of the $Zn_2SnO_4$ phase and a maximum peak intensity of $I_2$ in a (104) plane of the $In_2O_3$ phase as determined by X-ray diffractometry; and an intensity ratio ($I_2/I_1$) of $I_2$ to $I_1$ is 0.5 or less.

In yet another preferred embodiment of the present invention, the oxide sintered compact has a relative density of 90% or more and a resistivity of 1 Ωcm or less.

In addition and advantageously, the present invention provides a sputtering target which is derived from any of the oxide sintered compacts and has a relative density of 90% or more and a resistivity of 1 Ωcm or less.

Advantageous Effects of Invention

The present invention can give oxide sintered compacts and sputtering targets each having a low resistivity and a high relative density even employing rare-metal In in a smaller amount and can thereby significantly reduce the material cost. In addition, the present invention can give sputtering targets which exhibit superior direct-current discharge stability and have excellent in-plane uniformity and satisfactory stability in film quality. The sputtering targets of the present invention, when used, enable inexpensive and stable deposition of oxide semiconductor films having satisfactory carrier mobility through direct-current sputtering, because such direct-current sputtering easily enables high-speed film deposition and leads to better productivity.

DESCRIPTION OF EMBODIMENTS

Figure 1:
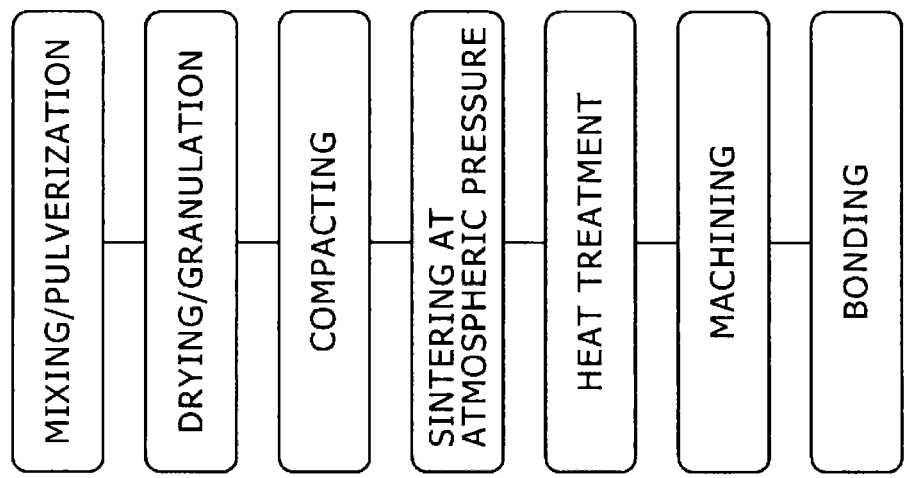
FIG. 1 illustrates basic steps for the production of an oxide sintered compact and a sputtering target according to embodiments of the present invention.

The present inventors made intensive investigations to provide an oxide sintered compact for a sputtering target, which is prepared by mixing and sintering powders of zinc oxide, tin oxide, and indium oxide, which has high electroconductivity (low resistivity) and a high relative density, which is applicable to direct-current sputtering, and which is suitable to deposition of an oxide semiconductor thin film having satisfactory carrier mobility. As a result, they have found that this object is achieved by allowing the oxide sintered compact to include a $Zn_2SnO_4$ phase as a main phase, to include an $In/In_2O_3$—$ZnSnO_3$ solid solution containing $ZnSnO_3$ and, dissolved therein, In and/or $In_2O_3$, and to include substantially no $Zn_xIn_yO_z$ phase, wherein x, y, and z are independently arbitrary positive integers (i.e., substantially no $Zn_xIn_yO_z$ phase is detected), upon X-ray diffractometry.

Specifically, the present inventors have found on phase composition of the oxide sintered compact as determined by X-ray diffractometry that the object can be achieved by allowing the oxide sintered compact to have such a phase composition that (a) Zn and Sn are combined and present as a $Zn_2SnO_4$ compound (main phase) and a $ZnSnO_3$ compound and may be present as a $SnO_2$ compound or ZnO compound depending on the compositional ratio between Zn and Sn; that (b) In and/or $In_2O_3$ is present as an $In/In_2O_3$—$ZnSnO_3$ solid solution including $ZnSnO_3$ and, dissolved therein, In and/or $In_2O_3$, and may be present as an $In/In_2O_3$—$Zn_2SnO_4$ solid solution including $Zn_2SnO_4$ and, dissolved therein, In and/or $In_2O_3$ depending on the content of $In_2O_3^-$; and that (c) substantially no $Zn_xIn_yO_z$ phase, wherein x, y, and z are independently arbitrary positive integers, is present. The present inventors have further found out that (d) an oxide sintered compact having such phase composition may be obtained by sintering under predetermined conditions (preferably by firing at a temperature of 1350° C. to 1650° C. in a nonreducing atmosphere for 5 hours or longer). In addition, the present inventors have found that, for the application of direct-current sputtering such as plasma discharge from a direct-current power source, (e) a heat treatment after the sintering is preferably performed under controlled conditions typically at a temperature of 1000° C. or higher in a reducing atmosphere for 8 hours or longer, and this further allows the oxide sintered compact to have better electroconductivity. The present invention has been made based on these findings.

On the chemical composition of the oxide sintered compact (sputtering target), the present inventors have found that, when a predetermined amount of $In_2O_3$ is added to a ZTO oxide sintered compact for oxide semiconductors which is derived from ZnO and $SnO_2$ as materials, the resulting oxide sintered compact has a higher relative density and a lower resistivity and thereby gives a sputtering target which enables stable and continuous direct-current discharge. The present inventors have further found that a TFT having an oxide semiconductor thin film deposited using the sputtering target can have an extremely high carrier density of 15 $cm^2$/Vs or more.

More specifically, when containing metal elements Zn, Sn, and In in contents (in atomic percent) of [Zn], [Sn], and [In], the oxide sintered compact preferably has a ratio of [In] to a total of [Zn], [Sn], and [In] (hereinafter also referred to as an "[In] ratio") of 0.01 to 0.30, a ratio of [Zn] to a total of [Zn] and [Sn] (hereinafter also referred to as a "[Zn] ratio") of 0.50 to 0.75, and a ratio of [Sn] to a total of [Zn] and [Sn] (hereinafter also referred to as a "[Sn] ratio") of 0.25 to 0.50. The oxide sintered compact has an [In] ratio of 0.10 to 0.30, a [Zn] ratio of 0.50 to 0.67, and a [Sn] ratio of 0.33 to 0.50. The technique disclosed in PTL 5 specifies an [In] ratio higher than the above-specified range, a [Zn] ratio lower than the above-specified range, and a [Sn] ratio lower than the above-specified range for preparing a sputtering target having a chemical composition suitable for the deposition of transparent conductive films. Accordingly, the technique differs in preferred compositional ratios from the present invention which provides an oxide sintered compact and a sputtering target suitable for the deposition of oxide semiconductor thin films.

Constituent features and components of an oxide sintered compact according to an embodiment of the present invention will be illustrated in detail below.

Initially, a phase composition of the oxide sintered compact will be illustrated. As is described above, the oxide sintered compact of the present invention distinctively includes a $Zn_2SnO_4$ phase as a main phase and contains an $In/In_2O_3$—$ZnSnO_3$ solid solution, in which substantially no $Zn_xIn_yO_z$ phase, wherein x, y, and z are independently arbitrary positive integers, is detected upon X-ray diffractometry.

X-ray diffractometry herein is performed under following conditions.

Analyzer: "X-ray Diffractometer RINT-1500" supplied by Rigaku Corporation
Analysis Conditions
Target: Cu
Monochromatization: Use of monochromator (Kα radiation)
Target output: 40 kV, 200 mA
Continuous Measurement: θ/2θ Scanning
Slits: Divergence slit: ½°, Scattering slit: ½°, Receiving slit: 0.15 mm
Monochromator receiving slit: 0.6 mm
Scanning speed: 2°/min
Sampling interval: 0.02°
Measurement angle (2θ): 5° to 90°

Next, compounds to be detected or not detected upon the X-ray diffractometry will be illustrated in detail. As used herein the term "not detected" or "(substantially) no . . . is detected" refers to that the amount of a compound in question is below the detection limit in the X-ray diffractometry.

$Zn_2SnO_4$ Compound

ZnO and $SnO_2$, which will constitute the oxide sintered compact of the present invention, are combined with each other to form a $Zn_2SnO_4$ compound (phase). This compound is a so-called spinel type compound, is characteristically rich in properties as an electronic material, while the properties may vary depending on its crystal structure. The compound for use in the present invention largely contributes to a higher relative density and a lower resistivity of the oxide sintered compact.

The oxide sintered compact of the present invention includes the $Zn_2SnO_4$ compound as a main phase. As used herein the term "main phase" refers to a compound present in a largest ratio (largest proportion) among all compounds detected by the X-ray diffractometry.

The oxide sintered compact may further include a $ZnSnO_3$ compound (phase). This compound may be formed in some compositional ratios between Zn and Sn, but does not adversely affect properties (high relative density and low resistivity) of the oxide sintered compact and does not adversely affect properties (e.g., high carrier mobility) of the semiconductor thin film after deposition.

The oxide sintered compact of the present invention may further include certain amounts of $SnO_2$ and/or ZnO, in addition to the compounds. In some compositional ratios between Zn and Sn, such $SnO_2$ and ZnO compounds may be detected in addition to the $Zn_2SnO_4$ compound. However, the $SnO_2$ and ZnO compounds, when present in trace amounts, do not adversely affect direct-current discharge stability upon sputtering and do not adversely affect the properties of the thin film semiconductor after deposition. Typically, when [Zn] times two equals [Sn] and when all Zn and Sn form a composite compound, only the $Zn_2SnO_4$ phase should theoretically be detected. However, a $ZnSnO_3$ phase is also formed in fact, and the $ZnSnO_3$ phase does not adversely affect properties of the sputtering target, as described above. By contrast, when [Zn] times two is larger than [Sn], a trace amount of ZnO, which has not contributed to the formation of the compound, may be detected; and, when [Zn] times two is smaller than [Sn], a trace amount of $SnO_2$ may be detected. In any case, the formed compound does not adversely affect the properties of the oxide sintered compact and sputtering target.

$In/In_2O_3$—$ZnSnO_3$ Solid Solution and $Zn_xIn_yO_z$ Compound

The oxide sintered compact of the present invention includes an $In/In_2O_3$—$ZnSnO_3$ solid solution. As used herein the term "$In/In_2O_3$—$ZnSnO_3$ solid solution" refers to a solid solution including $ZnSnO_3$ and, dissolved therein, In and/or $In_2O_3$ as a solute. The term "solid solution" refers to one solid which is formed by incorporating one or more other atoms (solutes) interstitially through fitting into space between matrix atoms; or substitutionally through replacing a matrix atom. The $In/In_2O_3$—$ZnSnO_3$ solid solution herein may speculatively be formed mainly interstitially by fitting In or $In_2O_3$ into space between $ZnSnO_3$ particles. In some compositions of $In_2O_3$, part of $In_2O_3$ may be present as a solute in the main phase $Zn_2SnO_4$ to form a solid solution. Thus, the oxide sintered compact of the present invention can have a higher density because of the presence of In and/or $In_2O_3$ as a solute in $ZnSnO_3$ (or further in $Zn_2SnO_4$).

Whether or not a substance is present as a solid solution can be determined by determining whether or not the compound has a peak shifted to a lower angle than that of a pure compound (phase) through X-ray diffractometry (XRD) under the above-mentioned conditions. For example, in the case of the "In/In$_2$O$_3$—ZnSnO$_3$ solid solution", whether or not In and/or In$_2$O$_3$ forms a solid solution with ZnSnO$_3$ can be determined by comparing data obtained by XRD and data obtained by scanning electron microscope with energy dispersive x-ray (SEM-EDX) quantitative analysis. Typically, the ICDD (International Centre for Diffraction Data) cards used in XRD indicate orientations of In$_2$O$_3$ and ZnSnO$_3$ respectively in diffraction angles 2θ, whose peak positions are slightly shifted. This is probably because the compound to be measured is not a pure compound but a compound having a modified lattice constant because of including another atom in grains. In addition, SEM-EDX demonstrates that indium is detected in ZnSnO$_3$, indicating that the compound has a structure different from that of pure IN$_2$O$_3$. From these, it can be judged that a solid solution with In or In$_2$O$_3$ is formed in ZnSnO$_3$.

It should be noted, however, that the oxide sintered compact of the present invention includes substantially no Zn$_x$In$_y$O$_z$ phase wherein x, y, and z are independently arbitrary positive integers. The Zn$_x$In$_y$O$_z$ phase is a multicomponent oxide (spinel-type compound) including In and Zn combined with oxygen (O). However, this phase exhibits high insulation, and, if contained in the oxide sintered compact, may cause the oxide sintered compact to have higher resistance because of high insulation, may cause abnormal discharge, and may impede densification. In addition, Zn$_x$In$_y$O$_z$, when scattered as clusters, may migrate into the thin film to cause the thin film to have poor semiconducting properties and poor carrier mobility. Thus, the presence of the Zn$_x$In$_y$O$_z$ phase may adversely affect densification and reduction in resistance and may cause abnormal discharge. Influence of the Zn$_x$In$_y$O$_z$ phase on these properties may vary also depending on the amount thereof. Specifically, the Zn$_x$In$_y$O$_z$ phase, if contained in a large amount, may significantly adversely affect all of the properties; but, if contained only in a trace amount, may probably cause abnormal discharge alone. This is because abnormal discharge can occur even when a highly resistant compound is present in a trace amount. Typically, a sample of Comparative Example 2 mentioned below included only a small amount of Zn$_5$In$_2$O$_8$ and included no Zn$_4$In$_2$O$_7$ (no Zn$_4$In$_2$O$_7$ was detected) (see FIG. 6), thereby had a density and overall resistance little affected, had a good relative density and a good resistivity, but suffered from local abnormal discharge.

The oxide sintered compact of the present invention, as having the phase composition, can have a low resistivity (1 Ω·cm or less) and a high relative density (90% or more) even though containing indium in a small amount. The [In] ratio herein is preferably from 0.01 to 0.30, and more preferably from 0.10 to 0.30. Such an In—Zn—Sn—O oxide sintered compact according to an embodiment of the present invention may often have a lower relative density if a Zn$_x$In$_y$O$_z$ phase is present in addition to the Zn$_2$SnO$_4$ main phase; but may rather give a sputtering target having a higher density when including an In/In$_2$O$_3$—ZnSnO$_3$ solid-solution phase (and, in addition, an In/In$_2$O$_3$—Zn$_2$SnO$_4$ solid-solution phase to be formed according to necessity). While its detailed mechanism remains unknown, this is probably because In$_2$O$_3$ and In are present so as to fill space among particles of the material oxides to thereby contribute to a higher density of the oxide sintered compact.

The oxide sintered compact of the present invention, when subjected to X-ray diffractometry under the conditions and having a maximum peak intensity of I$_1$ of (311) plane of the Zn$_2$SnO$_4$ phase and a maximum peak intensity of I$_2$ in a (104) plane of the In$_2$O$_3$ phase, the intensity ratio of I$_2$ to I$_1$ (I$_2$/I$_1$) is preferably 0.5 or less. By controlling the intensity ratio to be 0.5 or less, the resulting thin film deposited by sputtering has a not-degenerate band gap and can have semiconducting properties at high level. The intensity ratio is more preferably 0.25 or less. Though not critical, the intensity ratio is preferably 0.01 or more in terms of its lower limit in consideration of the preferred lower limit of the [In] ratio.

The intensity ratio can be determined based on a chart plotted as a result of the X-ray diffractometry by calculation from maximum peak intensities present in an arbitrary range (for example, in a range of 2θ of 15° to 65°). The present inventors have focused attention on maximum peak intensities of the (311) plane of the Zn$_2$SnO$_4$ phase and the (104) plane of the In$_2$O$_3$ phase. This is because the present inventors have considered that the ratio between the compounds more correctly influence the properties of the product thin film than the ratio between added amounts of the respective material oxides does.

Next, preferred compositional ratios (atomic ratios) of metal elements constituting the oxide sintered compact of the present invention will be described. Hereinafter a ratio of [In] to a total of [Zn], [Sn], and [In] is referred to an [In] ratio; a ratio of [Zn] to a total of [Zn] and [Sn] is referred to a [Zn] ratio; and a ratio of [Sn] to a total of [Zn] and [Sn] is referred to a [Sn] ratio.

The oxide sintered compact preferably has an [In] ratio of from 0.01 to 0.30. An oxide sintered compact having an [In] ratio of less than 0.01 may not enjoy sufficient improvement in relative density and sufficient reduction in resistivity and may give, through deposition, a thin film having insufficient carrier mobility. In contrast, an oxide sintered compact having an [In] ratio of more than 0.30 may give a thin film having inferior TFT switching properties. The oxide sintered compact more preferably has an [In] ratio of 0.05 or more and 0.25 or less.

The oxide sintered compact preferably has a [Zn] ratio of from 0.50 to 0.75. An oxide sintered compact having a [Zn] ratio of less than 0.50 may give, through sputtering, a thin film which is difficult to be subjected to high-precision patterning (patterning with a high precision) and is liable to suffer from etch residue. In contrast, an oxide sintered compact having a [Zn] ratio of more than 0.75 may give, through deposition, a thin film which has insufficient chemical resistance and is difficult to be subjected to high-precision patterning, because the thin film is rapidly dissolved by the action of an acid. The oxide sintered compact more preferably has a [Zn] ratio of from 0.50 to 0.67.

The oxide sintered compact preferably has a [Sn] ratio of from 0.25 to 0.50. An oxide sintered compact having a [Sn] ratio out of the above-specified range may cause a TFT to have inferior switching properties and may fail to give a high-performance display device. The oxide sintered compact more preferably has a [Sn] ratio of from 0.33 to 0.50.

The oxide sintered compact of the present invention may have a relative density of 90% or more and a resistivity of 1 Ωcm or less.

Relative Density of 90% or More

The oxide sintered compact of the present invention has an extremely high relative density of preferably 90% or more and more preferably 95% or more. Such high relative density prevents the generation of cracks and nodules during sputtering and, in addition, advantageously continuously maintains stable discharge until the target life.

Resistivity of 1 Ωcm or Less

The oxide sintered compact of the present invention has a small resistivity of preferably 1 Ωcm or less, and more preferably 0.1 Ωcm or less. This enables film deposition by direct-current sputtering (e.g., plasma discharge using a direct-current power source) and enables efficient physical vapor deposition (sputtering) in a production line of display devices.

Next, a method of producing an oxide sintered compact of the present invention will be illustrated.

The oxide sintered compact of the present invention may be obtained by mixing powders of zinc oxide, tin oxide, and indium oxide to give a mixture and sintering the mixture. FIG. 1 illustrates basic production steps to give a sputtering target from material powders. FIG. 1 sequentially illustrates basic steps of mixing and pulverizing oxide powders; drying and granulating the mixture; compacting the granules to give a powder compact; sintering the powder compact at atmospheric pressure; thermally treating the sintered compact to give an oxide sintered compact; patterning the oxide sintered compact; and bonding the processed sintered compact to give a sputtering target. Of the steps, the step of sintering and the subsequent step of heat treatment are characteristically performed under suitably controlled conditions according to the present invention. The other steps are not limited and may suitably select and employ generally used steps (processes). Respective steps will be illustrated below, which are by no means intended to limit the scope of the present invention.

Initially, zinc oxide powder, tin oxide powder, and indium oxide powder are blended in predetermined ratios, mixed and pulverized. The material powders to be used preferably each have a purity of about 99.99% or more. This is because an impurity element, if present in a trace amount, may adversely affect semiconducting properties of the oxide semiconductor film. The blending ratios of the material powders are preferably controlled so as to give ratios among Zn, Sn, and In be within the above-specified ranges.

The mixing and pulverization are preferably performed in a pot mill by placing material powders together with water in the pot mill. A ball or bead to be used in these steps preferably includes, for example, a nylon, alumina, or zirconia as a material.

Next, a powder mixture obtained in the precedent step is dried, granulated, and compacted (molded). The compaction is preferably performed by charging the dried and granulated powder into a die having predetermined dimensions, preforming the powder through die press to give a preform, and compacting the preform typically through cold isostatic pressing (CIP). To allow the sintered compact to have a higher relative density, the preforming is preferably performed at a pressure controlled to be about 0.2 tonf/cm$^2$ or more, and the compaction is preferably performed at a pressure controlled to be about 1.2 tonf/cm$^2$ or more.

Next, the prepared compact is fired at atmospheric pressure. The compact herein is preferably sintered by firing at a temperature of about 1350° C. to 1650° C. for a holding time of about 5 hours or longer so as to have a desired compound phase composition and a higher relative density. The higher the firing temperature is, the more easily the sintered compact has a higher relative density and the shorter time the treatment can complete, thus being preferred. However, firing performed at an excessively high temperature may often cause the sintered compact to decompose. To avoid this, the firing is preferably performed under conditions within the above-specified range. The firing is more preferably performed at a temperature of about 1450° C. to 1600° C. for a holding time of about 8 hours or longer. The firing is preferably performed in a nonreducing atmosphere, which atmosphere is preferably controlled typically by introducing oxygen gas into a furnace. The sintering treatment (firing) allows the resulting sintered compact to have a resistivity improved typically from about 100 Ωcm (before sintering) up to 0.1 Ωcm (after sintering).

Next, the prepared sintered compact is subjected to a heat treatment and yields an oxide sintered compact of the present invention. The heat treatment herein is preferably controlled and performed at a temperature of about 1000° C. or higher for a holding time of about 8 hours or longer so as to enable plasma discharge using a direct-current power source. The heat treatment is more preferably performed at a firing temperature of about 1100° C. or higher for a holding time of about 10 hours or longer. In contrast, a heat treatment performed at a firing temperature of higher than 1300° C. may cause Zn to vaporize to thereby alter the chemical composition. To avoid this, the heat treatment is preferably performed at a temperature of 1300° C. or lower. For cost reduction, the heat treatment is preferably performed for a holding time of about 30 hours or shorter. The heat treatment is preferably performed in a reducing atmosphere, which atmosphere is preferably controlled typically by introducing nitrogen gas into a furnace.

The above-prepared oxide sintered compact may be subjected to patterning and subsequent bonding according to common procedures and thereby yields a sputtering target of the present invention. The resulting sputtering target is also very satisfactory in relative density and resistivity as with the oxide sintered compact and preferably has a relative density of about 90% or more and a resistivity of about 1 Ωcm or less.

EXAMPLES

The present invention will be illustrated in further detail below with reference to several examples. It should be noted, however, that the examples are by no means construed to limit the scope of the invention; and various changes and modifications without departing from the spirit and scope of the invention are possible and fall within the scope of the invention.

Experimental Example 1

A zinc oxide powder (JIS Class 1, 99.99% purity), a 99.99%-purity tin oxide powder, and a 99.99%-purity indium oxide powder were blended in a ratio of [Zn]:[Sn]:[In] of 40.0:40.0:20.0 and mixed in a nylon ball mill for 20 hours. Next, a powder mixture obtained in the step was dried, granulated, preformed through die press at a pressure of 0.5 tonf/cm$^2$, and compacted through CIP at a pressure of 3 tonf/cm$^2$.

The resulting compact was sintered by holding at 1500° C. at atmospheric pressure for 7 hours. The sintering was performed in an oxygen atmosphere by feeding oxygen gas into a sintering furnace. The compact after sintering was introduced into a heat treatment furnace and heat-treated at 1200° C. for 10 hours. The heat treatment was performed in a reducing atmosphere by feeding nitrogen gas into the heat treatment furnace.

Figure 2:
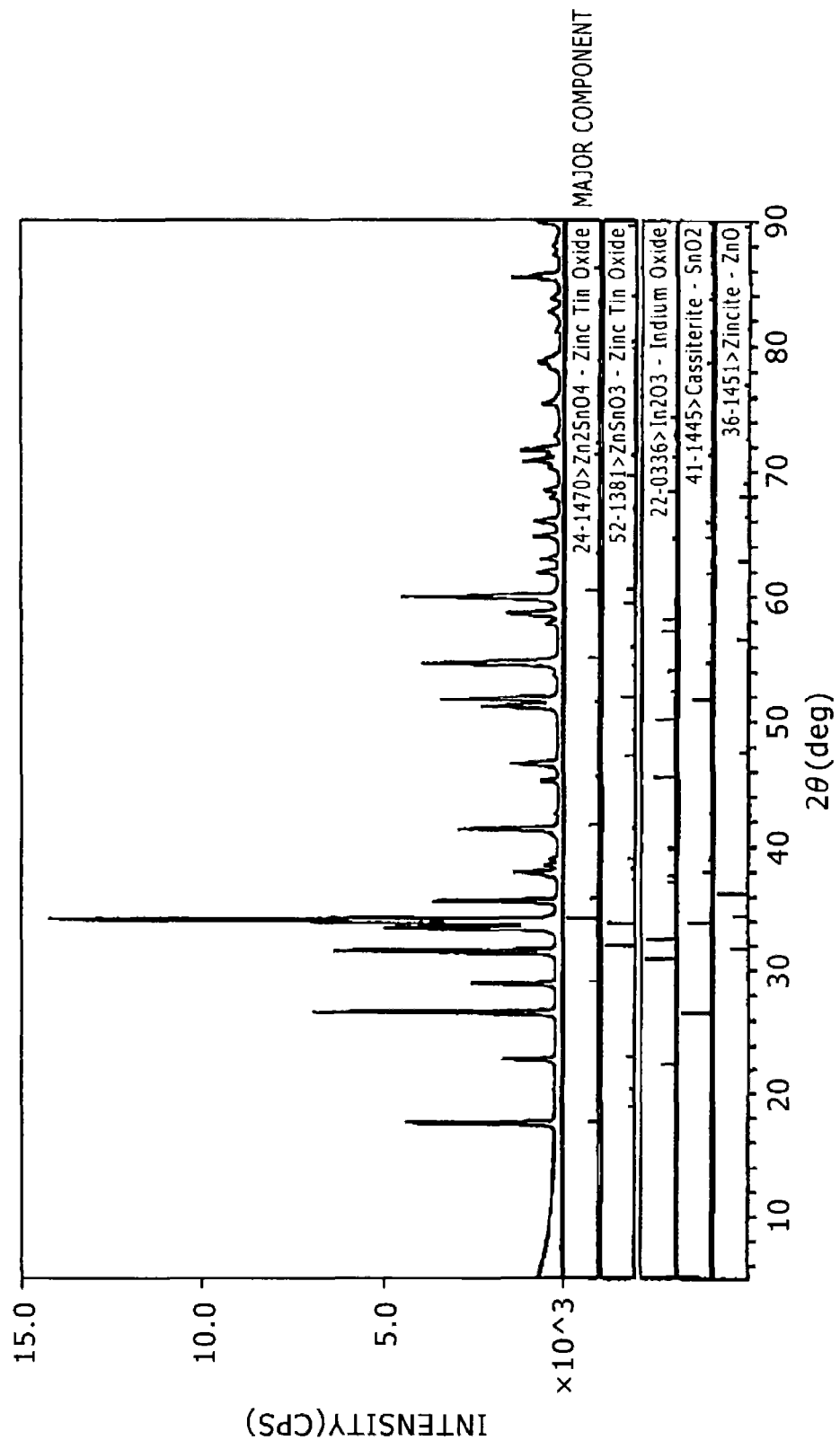
FIG. 2 is a graph illustrating data in X-ray diffractometry of an oxide sintered compact of the present invention (Sample No. 2 in Table 1) as Experimental Example 1.

Thus, an oxide sintered compact of Experimental Example 1 was obtained. The oxide sintered compact was analyzed by X-ray diffractometry under the aforementioned conditions, whose results are indicated in FIG. 2 and as Sample No. 2 in Table 1. FIG. 2 and Table 1 demonstrate that the oxide sintered compact included $Zn_2SnO_4$, $ZnSnO_3$, and $In/In_2O_3$—$ZnSnO_3$ solid solution, but substantially no $Zn_xIn_yO_z$ was detected. The oxide sintered compact, when subjected to X-ray diffractometry under the conditions, was found to have a maximum peak intensity of $I_1$ in a (311) plane of the $Zn_2SnO_4$ phase and a maximum peak intensity of $I_2$ in a (104)

plane of the In$_2$O$_3$ phase and to have an intensity ratio (I$_2$/I$_1$) of 0.44 within the preferred range (0.5 or less) in the present invention.

TABLE 1

| Number | Category | | [In] ratio | [Zn] ratio | [Sn] ratio | X-ray diffraction peak | | | Intensity ratio I$_2$/I$_1$ |
| --- | --- | --- | --- | --- | --- | --- | --- | --- | --- |
| | | | | | | Zn$_2$SnO$_4$ | In/In$_2$O$_3$—ZnSnO$_3$ solid solution | Zn$_x$In$_y$O$_z$ | |
| 1 | Referential Example | ZTO | 0 | 0.67 | 0.33 | present | absent | — | — |
| 2 | Experimental Example 1 | In-ZTO | 0.20 | 0.50 | 0.50 | present | present | absent | 0.44 |
| 3 | Experimental Example 2 | In-ZTO | 0.20 | 0.60 | 0.40 | present | present | absent | 0.24 |
| 4 | Experimental Example 3 | In-ZTO | 0.20 | 0.66 | 0.34 | present | present | absent | 0.15 |
| 5 | Comparative Example 1 | Al-ZTO | 0$^{note)}$ | 0.67 | 0.33 | present | absent | — | — |
| 6 | Comparative Example 2 | In-ZTO | 0.20 | 0.80 | 0.20 | present | present | present | 0 |

* [In] ratio = [In]/([Zn] + [Sn] + [In])
[Zn] ratio = [Zn]/([Zn] + [Sn])
[Sn] ratio = [Sn]/([Zn] + [Sn])
$^{note)}$Aluminum oxide was used instead of indium oxide In addition, the sintered compact was machined into dimensions of 4 inches in diameter and 5 mm in thickness, bonded to a backing plate, and yielded a sputtering target. The resulting sputtering target was mounted to a sputtering apparatus, followed by DC (direct-current) magnetron sputtering. The sputtering was performed under conditions at a DC sputtering power of 150 W in an oxygen O$_2$ atmosphere containing 0.1 percent by volume of Ar at a pressure of 0.8 mTorr. As a result, it was found that discharge stably occurred without abnormal discharge (arcing).

The prepared sputtering target was found to have a relative density of 97% as measured by the Archimedes' method; and to have a resistivity of 6 Ωcm as measured by the four probe method, both being satisfactory results.

In addition, the sputtering target was used in sputtering under the conditions to deposit a thin film, and the thin film was used to give a thin-film transistor having a channel length of 10 μm and a channel width of 100 μm. The thin-film transistor was found to have a high carrier mobility of 15 cm$^2$/Vs.

Experimental Example 2

An oxide sintered compact of Experimental Example 2 was prepared by the procedure of Experimental Example 1, except for blending the materials in a ratio of [Zn]:[Sn]:[In] of 48.0:32.0:20.0, sintering the compact by holding at 1550° C. for 5 hours, and subsequently subjecting the compact to a heat treatment at 1150° C. for 14 hours.

Figure 3:
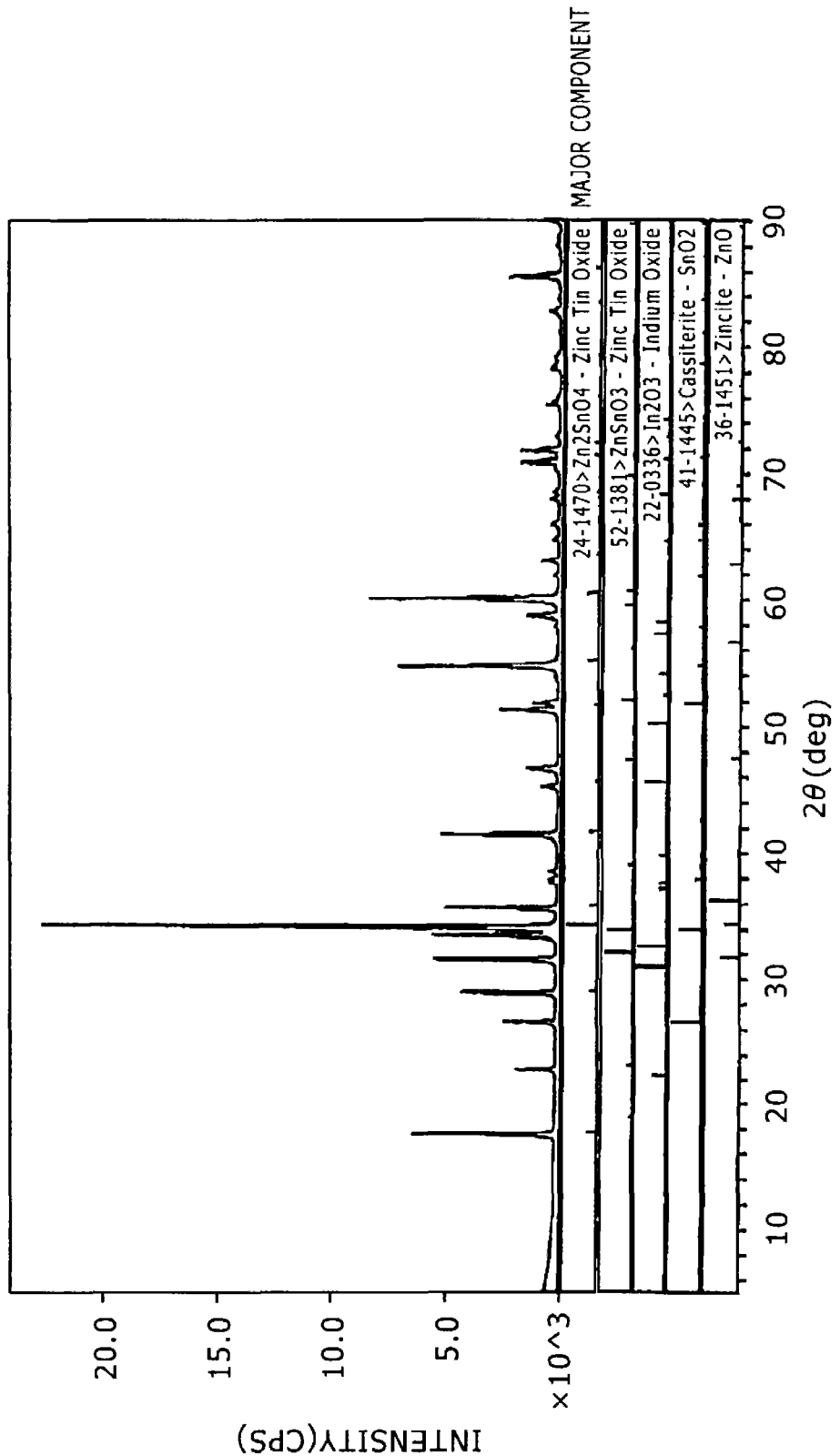
FIG. 3 is a graph illustrating data in X-ray diffractometry of an oxide sintered compact of the present invention (Sample No. 3 in Table 1) as Experimental Example 2.

The results are indicated in FIG. 3 and as Sample No. 3 in Table 1. FIG. 3 and Table 1 demonstrate that the oxide sintered compact included Zn$_2$SnO$_4$, ZnSnO$_3$, and In/In$_2$O$_3$—ZnSnO$_3$ solid solution, but substantially no Zn$_x$In$_y$O$_z$ was detected. The oxide sintered compact was subjected to X-ray diffractometry under the conditions and was found to have a maximum peak intensity of I$_1$ in a (311) plane of the Zn$_2$SnO$_4$ phase and a maximum peak intensity of I$_2$ in a (104) plane of the In$_2$O$_3$ phase and to have an intensity ratio (I$_2$/I$_1$) of 0.24 within the preferred range (0.5 or less) in the present invention.

In addition, the sintered compact was machined to give a sputtering target, subjected to sputtering by the procedure of Experimental Example 1, and was found to provide stable discharge. The resulting sputtering target was found to have a satisfactory relative density of 93% and a good resistivity of 5 mΩcm as measured by the procedure of Experimental Example 1. The sputtering target was used in film deposition by sputtering under the conditions to give a thin film. The thin film was subjected to carrier mobility measurement by the procedure of Experimental Example 1 and was found to have a high carrier mobility of 15 cm$^2$/Vs.

Experimental Example 3

An oxide sintered compact of Experimental Example 3 was prepared by the procedure of Experimental Example 1, except for blending the materials in a ratio of [Zn]:[Sn]:[In] of 53.0:27.0:20.0, sintering the compact by holding at 1600° C. for 8 hours, and subsequently subjecting the compact to a heat treatment at 1200° C. for 16 hours.

Figure 4:
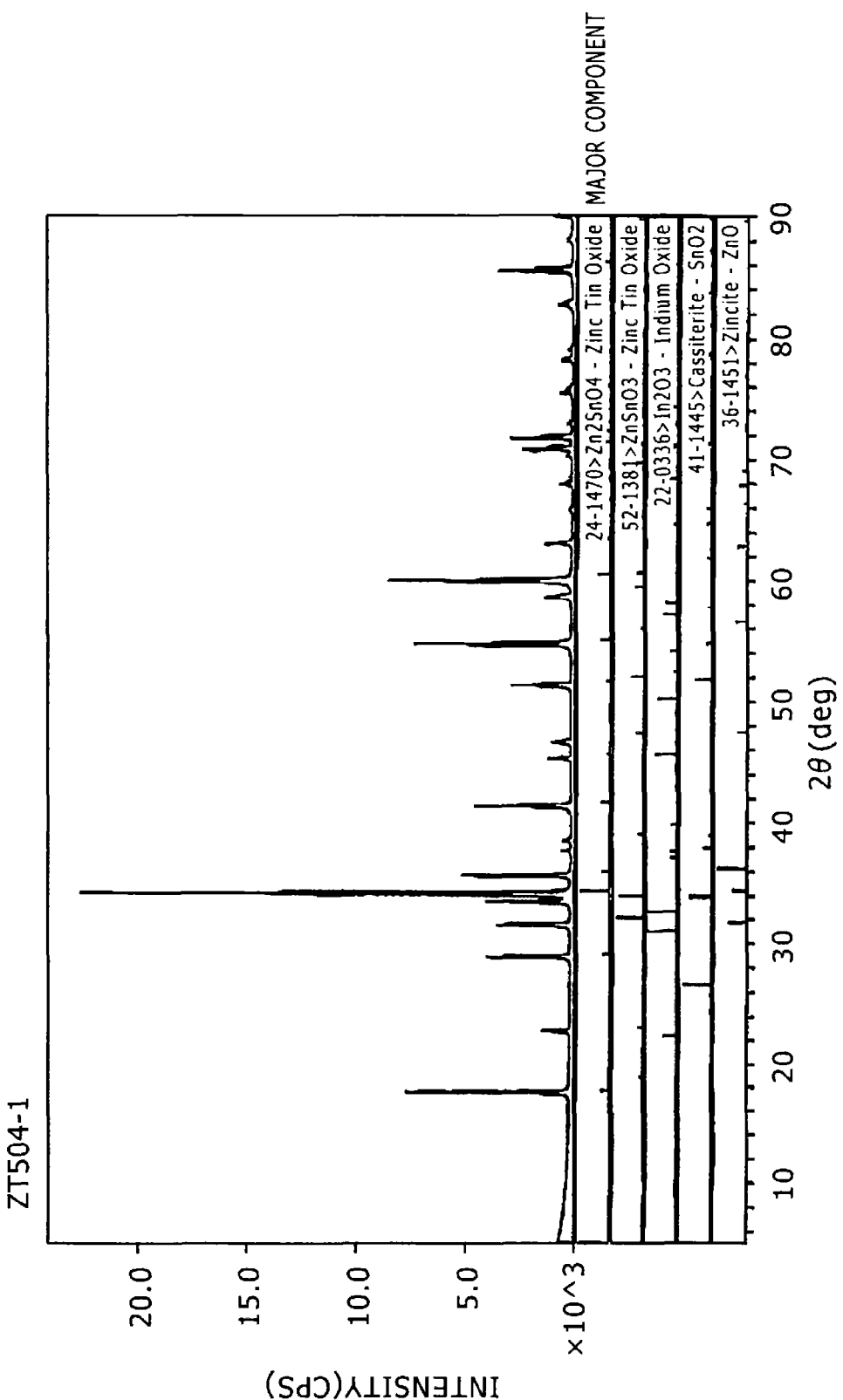
FIG. 4 is a graph illustrating data in X-ray diffractometry of an oxide sintered compact of the present invention (Sample No. 4 in Table 1) as Experimental Example 3.

The results are indicated in FIG. 4 and as Sample No. 4 in Table 1. FIG. 4 and Table 1 demonstrate that the oxide sintered compact included Zn$_2$SnO$_4$, ZnSnO$_3$, and In/In$_2$O$_3$—ZnSnO$_3$ solid solution, but substantially no Zn$_x$In$_y$O$_z$ was detected. Independently, the oxide sintered compact was subjected to X-ray diffractometry under the conditions and was found to have a maximum peak intensity of I$_1$ in a (311) plane of the Zn$_2$SnO$_4$ phase and a maximum peak intensity of I$_2$ in a (104) plane of the In$_2$O$_3$ phase and to have an intensity ratio (I$_2$/I$_1$) of 0.15 within the preferred range (0.5 or less) in the present invention.

In addition, the sintered compact was machined to give a sputtering target, subjected to sputtering by the procedure of Experimental Example 1, and was found to provide stable discharge. The resulting sputtering target was found to have a satisfactory relative density of 96% and a good resistivity of 3 mΩcm, as measured by the procedure of Experimental Example 1. The sputtering target was used in film deposition by sputtering under the conditions to give a thin film. The thin film was subjected to carrier mobility measurement by the procedure of Experimental Example 1 and was found to have a high carrier mobility of 15 cm$^2$/Vs.

Comparative Example 1

An oxide sintered compact of Comparative Example 1 was prepared by the procedure of Experimental Example 1, except for using a 99.99%-purity aluminum oxide powder instead of the indium oxide powder, blending the materials in a ratio of [Zn]:[Sn]:[Al] of 43.3:21.7:35.0, sintering the compact by holding in a furnace at 1300° C. for 5 hours, and subsequently subjecting the compact to a heat treatment at 1200° C. for 10 hours.

Figure 5:
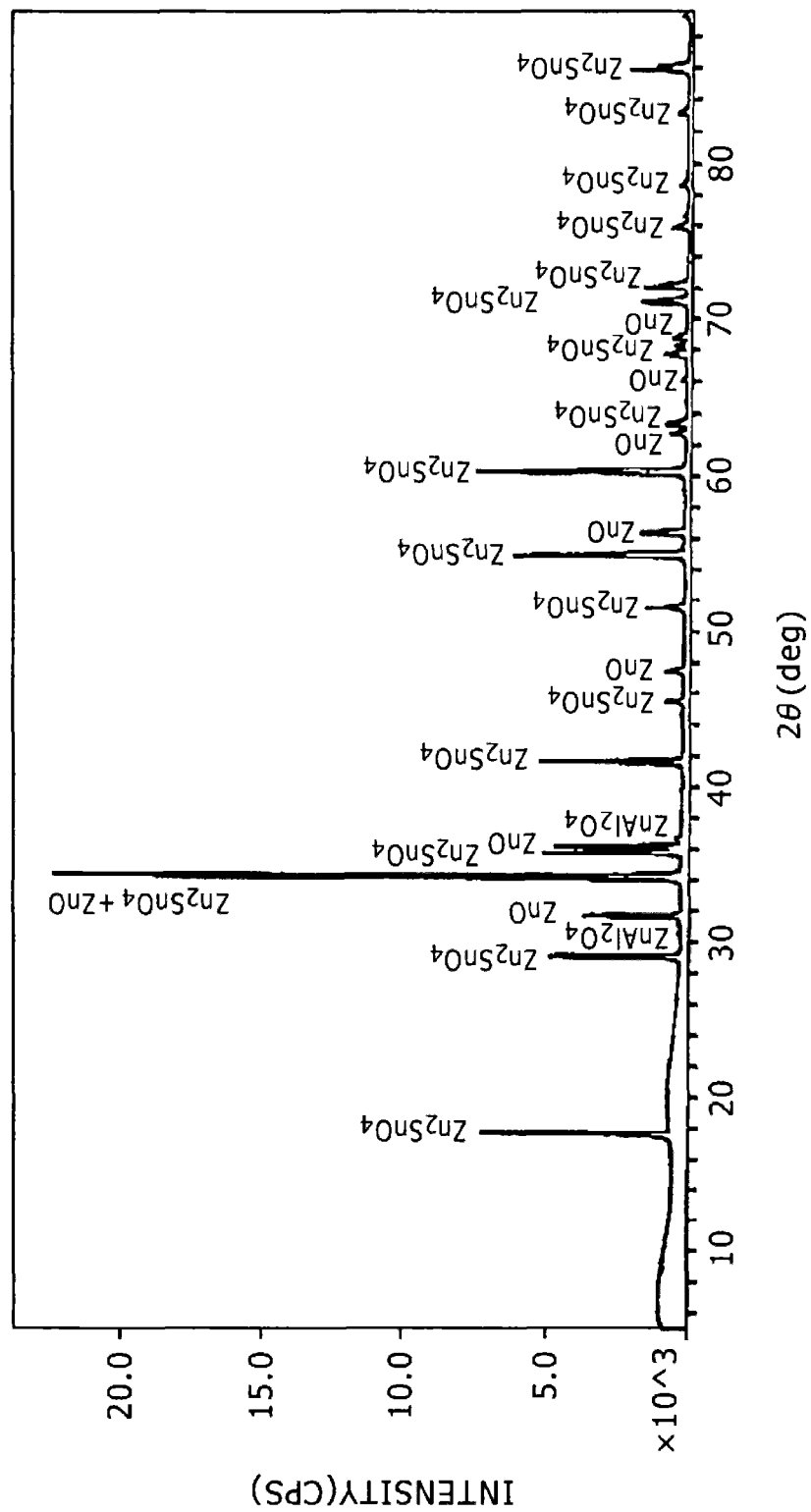
FIG. 5 is a graph illustrating data in X-ray diffractometry of an oxide sintered compact (Sample No. 5 in Table 1) as Comparative Example 1.

The results are indicated in FIG. 5 and as Sample No. 5 in Table 1. FIG. 5 demonstrates that the oxide sintered compact included $ZnAl_2O_4$ as detected in addition to $Zn_2SnO_4$ and ZnO.

The sintered compact was machined to give a sputtering target, subjected to sputtering by the procedure of Experimental Example 1, and was found to suffer from abnormal discharge during sputtering. The thus prepared sputtering target was found to have a low relative density of 67% and a high resistivity of 100 Ωcm as measured by the procedure of Experimental Example 1. The sputtering target was used in film deposition by sputtering under the conditions to give a thin film. The thin film was subjected to carrier mobility measurement by the procedure of Experimental Example 1 and was found to have a low carrier mobility of 3.0 $cm^2/Vs$.

The results confirmatively demonstrate that the addition of Al instead of In as in Comparative Example 1 did not effectively exhibit the advantageous effects of the addition of In (improvement in relative density and reduction in resistivity of the oxide sintered compact, and improvement in carrier mobility of the thin film).

Comparative Example 2

An oxide sintered compact of Comparative Example 2 was prepared by the procedure of Experimental Example 1, except for blending the materials in a ratio of [In]:[Zn]:[Sn] of 20.0:64.0:16.0, sintering the compact by holding in a furnace at 1400° C. for 2 hours, and subsequently subjecting the compact to a heat treatment at 1200° C. for 10 hours.

Figure 6:
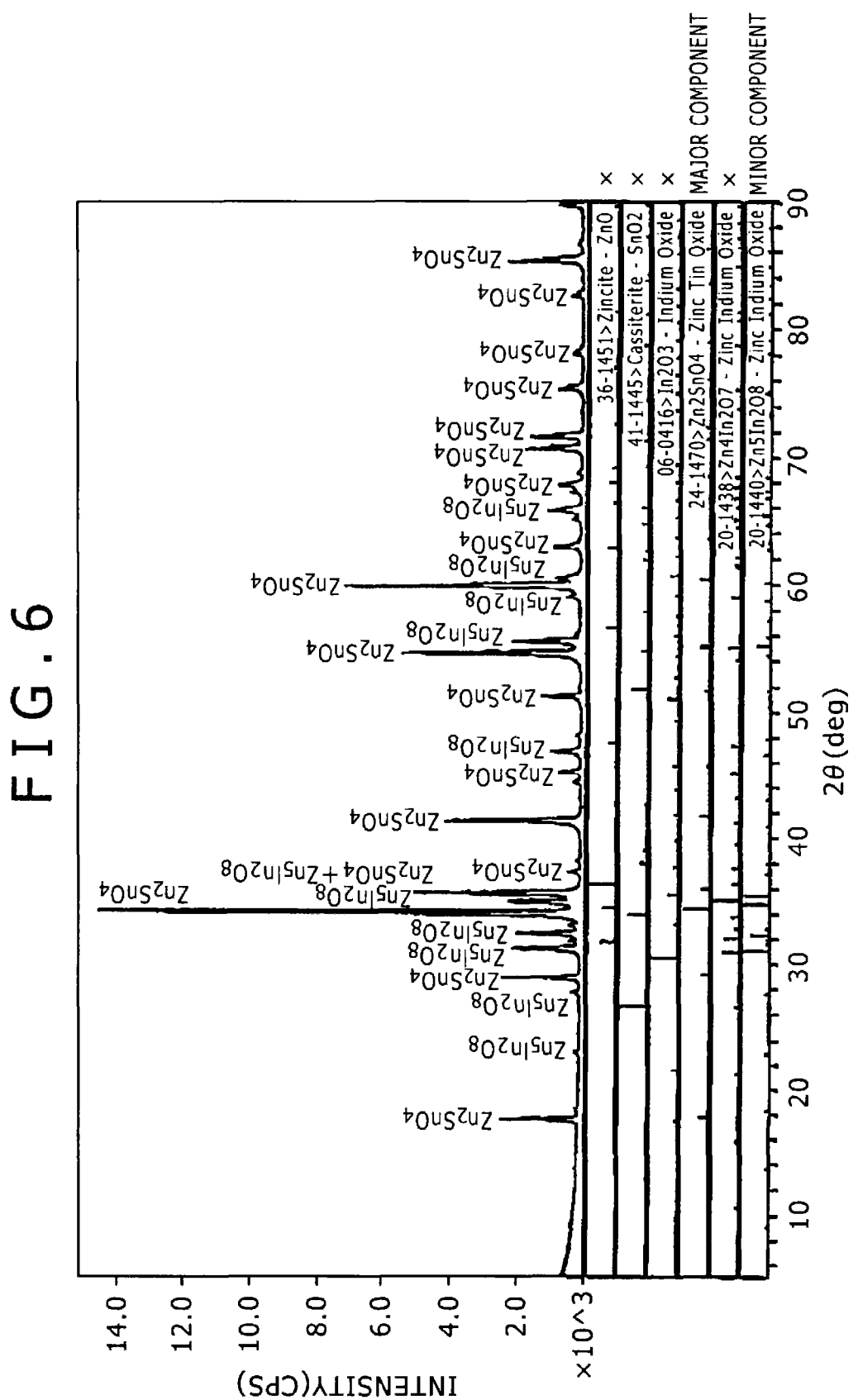
FIG. 6 is a graph illustrating data in X-ray diffractometry of an oxide sintered compact (Sample No. 6 in Table 1) as Comparative Example 2.

The results are indicated in FIG. 6 and as Sample No. 6 in Table 1. FIG. 6 demonstrates that the oxide sintered compact included a small amount of $Zn_5In_2O_8$ ($Zn_xIn_yO_z$ "present" in Table 1) in addition to $Zn_2SnO_4$.

In addition, the sintered compact was machined to give a sputtering target, subjected to sputtering by the procedure of Experimental Example 1, and was found to suffer from abnormal discharge during sputtering. The prepared sputtering target was found to have a good relative density of 91% and a good resistivity of 1 Ωcm or less as measured by the procedure of Experimental Example 1. The sputtering target was used in film deposition by sputtering under the conditions to give a thin film. The thin film was subjected to carrier mobility measurement and was found to have a carrier mobility of 12 $cm^2/Vs$ which is somewhat lower than those of Sample Nos. 1 to 5 but is satisfactory.

The results demonstrate that a sample as with Comparative Example 2 having an [In] ratio and a [Zn] ratio out of preferred ranges in the present invention and thereby including a small amount of $Zn_xIn_yO_z$ suffered from abnormal discharge, although being good in relative density, resistivity, and carrier density.

Referential Example

A ZTO sintered compact including no indium oxide was prepared in this referential example by the following method.

Initially, a ZTO sintered compact was prepared by the procedure of Experimental Example 1, except for blending the same zinc oxide powder and tin oxide powder as in Experimental Example 1 in a ratio of [Zn]:[Sn] of 66.7:33.3, sintering the compact by holding at 1500° C. for 7 hours, and subjecting the compact after sintering to a heat treatment at 1200° C. for 10 hours.

The results are indicated as Sample No. 1 in Table 1. Table 1 demonstrates that the oxide sintered compact included $Zn_2SnO_4$, but none of $ZnSnO_3$, $In/In_2O_3$—$ZnSnO_3$ solid solution, and $Zn_xIn_yO_z$ was detected.

The sintered compact was machined to give a sputtering target, subjected to sputtering by the procedure of Experimental Example 1, and was found to provide stable discharge. The prepared sputtering target was found to have a good relative density of 90% or more and a good resistivity of 1 Ωcm or less, as measured by the procedure of Experimental Example 1. In addition, the sputtering target was used in film deposition by sputtering under the conditions to deposit a thin film. The thin film was subjected to carrier mobility measurement by the procedure of Experimental Example 1 and was found to have a high carrier mobility of 10 $cm^2/Vs$ or more.

These experimental results demonstrate that the oxide sintered compacts of Experimental Examples 1 to 3 each included compound phases specified in the present invention, had compositional ratios of metals constituting the oxide sintered compacts within preferred ranges in the present invention, thereby gave sputtering targets which had a high relative density and a low resistivity and exhibited extremely satisfactory properties; and that the sputtering targets gave thin films having a high carrier mobility and thus being extremely useful as oxide semiconductor thin films.

The invention claimed is:

1. An oxide sintered compact obtained by a method comprising mixing and sintering powders of zinc oxide, tin oxide, and indium oxide,
    wherein the oxide sintered compact comprises:
    a $Zn_2SnO_4$ phase as a main phase;
    an $In/In_2O_3$—$ZnSnO_3$ solution comprising $ZnSnO_3$, and dissolved therein, In, $In_2O_3$, or both; and
    no trace amount of $Zn_xIn_yO_z$ phase, where x, y, and z are each independently a positive integer detected upon X-ray diffractometry.

2. The oxide sintered compact of claim 1, wherein
    the oxide sintered compact comprises metal elements Zn, Sn, and In in contents, by atomic percent, of [Zn], [Sn], and [In]; and
    a ratio of
    [In]/([Zn]+[Sn]+[In]) is from 0.01 to 0.30,
    [Zn]/([Zn]+[Sn]) is from 0.50 to 0.75, and
    [Sn]/([Zn]+[Sn]) is from 0.25 to 0.50.

3. A sputtering target derived from the oxide sintered compact of claim 2, wherein the sputtering target has a relative density of 90% or more and an electrical resistivity of 1 Ωcm or less.

4. The oxide sintered compact of claim 2, wherein the ratio of
    [In]/([Zn]+[Sn]+[In]) is from 0.10 to 0.30,
    [Zn]/([Zn]+[Sn]) is from 0.50 to 0.67,
    [Sn]/([Zn]+[Sn]) is from 0.33 to 0.50.

5. The oxide sintered compact of claim 4, wherein
    the oxide sintered compact has a maximum peak intensity of $I_1$ in a (311) plane of the $Zn_2SnO_4$ phase and a maximum peak intensity of $I_2$ in a (104) plane of an $In_2O_3$ phase as determined by X-ray diffractometry; and
    an intensity ratio ($I_2/I_1$) of $I_2$ to $I_1$ is 0.5 or less.

6. The oxide sintered compact of claim 5, wherein the intensity ratio is from 0.1 to 0.5.

7. The oxide sintered compact of claim 5, wherein the intensity ratio is from 0.1 to 0.25.

8. The oxide sintered compact of claim 4, wherein the oxide sintered compact has a relative density of 90% or more and an electrical resistivity of 1 Ωcm or less.

9. The oxide sintered compact of claim 8, wherein the oxide sintered compact has a relative density of 95% or more and an electrical resistivity of 0.1 Ωcm or less.

10. The oxide sintered compact of claim 2, wherein
the oxide sintered compact has a maximum peak intensity of $I_1$ in a (311) plane of the $Zn_2SnO_4$ phase and a maximum peak intensity of $I_2$ in a (104) plane of an $In_2O_3$ phase as determined by X-ray diffractometry; and
an intensity ratio $(I_2/I_1)$ of $I_2$ to $I_1$ is 0.5 or less.

11. The oxide sintered compact of claim 10, wherein the intensity ratio is from 0.1 to 0.5.

12. The oxide sintered compact of claim 10, wherein the intensity ratio is from 0.1 to 0.25.

13. The oxide sintered compact of claim 2, wherein the oxide sintered compact has a relative density of 90% or more and an electrical resistivity of 1 Ωcm or less.

14. The oxide sintered compact of claim 13, wherein the oxide sintered compact has a relative density of 95% or more and an electrical resistivity of 0.1 Ωcm or less.

15. The oxide sintered compact of claim 1, wherein the oxide sintered compact has a maximum peak intensity of $I_1$ in a (311) plane of the $Zn_2SnO_4$ phase and a maximum peak intensity of $I_2$ in a (104) plane of an $In_2O_3$ phase as determined by X-ray diffractometry; and
an intensity ratio $(I_2/I_1)$ of $I_2$ to $I_1$ is 0.5 or less.

16. The oxide sintered compact of claim 15, wherein the intensity ratio is from 0.1 to 0.5.

17. The oxide sintered compact of claim 15, wherein the intensity ratio is from 0.1 to 0.25.

18. The oxide sintered compact of claim 1, wherein the oxide sintered compact has a relative density of 90% or more and an electrical resistivity of 1 Ωcm or less.

19. The oxide sintered compact of claim 18, wherein the oxide sintered compact has a relative density of 95% or more and an electrical resistivity of 0.1 Ωcm or less.

20. A sputtering target derived from the oxide sintered compact of claim 1, wherein the sputtering target has a relative density of 90% or more and an electrical resistivity of 1 Ωcm or less.

* * * * *